United States Patent [19]

Moss et al.

[11] 4,402,067
[45] Aug. 30, 1983

[54] BIDIRECTIONAL DUAL PORT SERIALLY CONTROLLED PROGRAMMABLE READ-ONLY MEMORY

[76] Inventors: William E. Moss, 510 Humber Ct.; Shlomo Waser, 514 Humber Ct., both of Sunnyvale, Calif. 94086; Ury Priel, 21776 Collingsworth, Cupertino, Calif. 95014

[21] Appl. No.: 880,007

[22] Filed: Feb. 21, 1978

[51] Int. Cl.³ .......................................... G11C 13/00
[52] U.S. Cl. ................................... 365/219; 365/189
[58] Field of Search ...................... 365/49, 73, 77, 94, 365/189, 219, 220, 221, 230

[56] References Cited

U.S. PATENT DOCUMENTS

| | | | |
|---|---|---|---|
| 3,691,538 | 9/1972 | Haney | 365/219 |
| 3,753,242 | 8/1973 | Townsend | 365/94 |
| 3,772,658 | 11/1973 | Sarlo | 365/174 |
| 3,772,681 | 11/1973 | Skingle | 365/94 |
| 3,821,724 | 6/1974 | Warner | 365/78 |
| 3,969,706 | 7/1976 | Proebsting et al. | 365/233 |
| 4,039,785 | 2/1977 | Ziemann | 365/94 |
| 4,128,900 | 12/1978 | Lappington | 365/94 |

Primary Examiner—Terrell W. Fears

[57] ABSTRACT

A bidirectional serially controlled programmable read-only memory has a serial input/output (I/O) port and a parallel I/O port. By selecting the appropriate control inputs, the instant invention can receive serial address or data information and output data to either the parallel or serial I/O ports. In a like manner, an address at the parallel I/O port can be utilized to generate output data in either a serial or parallel form. In general, the parallel I/O port will be utilized to transfer data to and from a microprocessor, whereas the serial I/O port will be utilized to transfer data to and from an external interface. By proper utilization of the control circuits and appropriate use of the control signals, data may be read from the bidirectional PROM in parallel form from the parallel I/O port or in serial form from the serial I/O port. In addition, data may be transferred from the serial I/O port to the parallel I/O port or from the parallel I/O port to the serial I/O port. Multiplexing means and register means interact with the control circuits to formulate the data transfers.

22 Claims, 12 Drawing Figures

FIG. 5  LOAD CONTROL ROUTINE

FIG. 6  LOAD ADDRESS AND DATA ROUTINE

FIG. 4  READ DATA ROUTINE

FIG. 10
EXTERNAL INTERFACE
CONTROL SEQUENCE

BIDIRECTIONAL DUAL PORT SERIALLY CONTROLLED PROGRAMMABLE READ-ONLY MEMORY

FIELD OF THE INVENTION

This invention relates generally to memory systems, and, more particularly, to a bidirectional serially controlled programmable read-only memory (PROM) having a serial input/output (I/O) port and a parallel I/O port for reading from and addressing the programmable read-only memory in either parallel or serial form. In addition, means are provided for the transfer of data from the serial I/O port to the parallel I/O port or from the parallel I/O port to the serial I/O port.

BACKGROUND OF THE INVENTION

A programmable read only memory (PROM) of the prior art is most conveniently thought of as being a non-volatile memory, such as a diode matrix, with a known number of parallel input ports and a known number of output ports. When a user acquires the PROM, any combination of logic signals applied to the parallel input ports causes all of the output ports to provide logic signals representative of '1' (logic '1').

The signals applied to the parallel input ports are usually referred to as an address. The address is said to be in parallel because signals comprising the address are applied simultaneously to the parallel input ports.

The non-volatile memory has signal paths that are connected together by fusible links. The user applies a voltage via an electronic programming apparatus to a fusible link to blow the link and thereby cause a disconnection between two signal paths of the non-volatile memory. Because of the disconnection, selected addresses cause a logic signal representative of '0' (logic '0') to be provided at one or more of the output ports. By selectively blowing the links, the output ports provide a predetermined group of logic signals, referred to as a data word, in response to an address.

In automotive applications, for example, the address may be representative of phenomena in any one of a plurality of spacially separated locations, such as temperature of a bearing and air in a fuel mixture in a carburetor. It is inconvenient to provide signal lines from the parallel input ports to each of the locations.

It is preferable if, for example, one signal line is connected from each of the locations via a multiplexer to a serial input port. That is to say, each of the logic signals of the address is serially applied, one at a time, at a serial port.

Prior art PROM's do not have the capability of handling data transfer and addressing of the non-volatile memory from both a serial and a parallel port.

Such capability, when required, was expensive due to the large number of individual IC's, less reliable due to the large number of inter-connections and cumbersome due to the large space required.

SUMMARY OF THE INVENTION

The bidirectional dual port serially controlled electronically programmable read-only memory of the instant invention serves a multiplicity of purposes. By selective utilization of the control circuits the parallel I/O port can communicate with the serial I/O port, depending upon the status of various control signals. As a result of data at the parallel I/O port, an eight bit word stored in a non-volatile memory can be read and transmitted to either the parallel I/O port as one eight bit word or to the serial I/O port as an eight bit pulse train. In a similar manner, data transmitted to a bidirectional data bus may be utilized to locate a word in the nonvolatile memory, which word can then be transmitted either serially to the serial I/O port or in parallel through the data bus.

In a preferred embodiment, a seven bit parallel input port permits 128 eight bit words in the nonvolatile memory to be addressed. Data at the serial I/O port, however, may be utilized as an address for selecting a word in the nonvolatile memory which may in turn be forwarded to either the parallel I/O port or serially transferred back to the serial I/O port or said data may be recognized as pure data and itself be made available in parallel form on the data bus.

In order to accomplish the design goals of the instant invention a variety of mutliplexing techniques, control signal generation, and shift register manipulations are required. The selection circuitry disclosed allows for the generation of all voltage and current levels necessary to program the read-only memory by destroying the selected fuse-link and at the same time confining the required voltage and current levels to the fuse in question and thus eliminate the problem of half-select currents.

In addition, one of the design objectives incorporated in the instant invention is the minimization of pin count. A function is built into two of the controls to accomplish this objective. The function utilizes the emitter to base breakdown voltage of the transistors utilized to implement the various functions set forth in the block diagram of the instant invention by providing for, in effect, three possible input states at a plurality of the control inputs. In the preferred embodiment these tristate inputs are the load control and clock inputs which are configured in such a way that when a higher than normal logical "1" (utilizing a positive logic notation) is encountered this high voltage input acts as both a logical "1" input and also provides the necessary voltage to create the emitter-base breakdown discussed earlier. For example, assume that first and second two-input NAND gates have a 6.5 volt zener diode coupled between the first inputs of each gate. The zener diode function can be implemented as the emitter-base junction of a transistor. Also, assume that a logical "0" is represented by approximately 0.8 volts and a logical "1" by 2.4 volts. If now a voltage of, for example, 8.4 volts is applied to one of the coupled inputs so as to cause the zener diode to breakdown, a logical "1" will be presented to both inputs.

It is therefore an object of this invention to provide a bidirectional dual port serially controlled electronically programmable read-only memory.

It is a further object of this invention to provide for a parallel addressing system such that the binary word addressed by the data on the address bus may be transmitted either in parallel form on the data bus or in a serial format via the serial I/O port.

It is a still further object of this invention to provide for the addressing of the programmable read-only memory from the serial I/O port such that the binary word addressed from the serial I/O port may be transmitted in a parallel format via the data bus or in a serial format via the serial I/O port.

It is yet another object of the instant invention to provide for transmission of data via the data bus to the serial I/O port without addressing the programmable read-only memory portion.

Finally, it is an object of the invention to provide a memory system including a PROM and control means for transferring information between a serial I/O port and a parallel I/O port.

According to a broad aspect of the invention there is provided a memory system comprising data bus means for carrying information, memory means coupled to said data bus means for storing said information, input/output means for providing addressing and control information to said memory means and data information to said data bus means, and control means for controlling said data bus means, said input/output means and said memory means, and for providing parallel addressing information to said memory means, parallel data information to and from said data bus means and serial data information to and from said input/output means.

The foregoing and other objects, features and advantages of this invention will be apparent from the following more particular description of the preferred embodiments of the invention as illustrated in the accompanying drawings.

DETAILED DESCRIPTION OF THE PREFERRED EMBODIMENT

Figure 1:
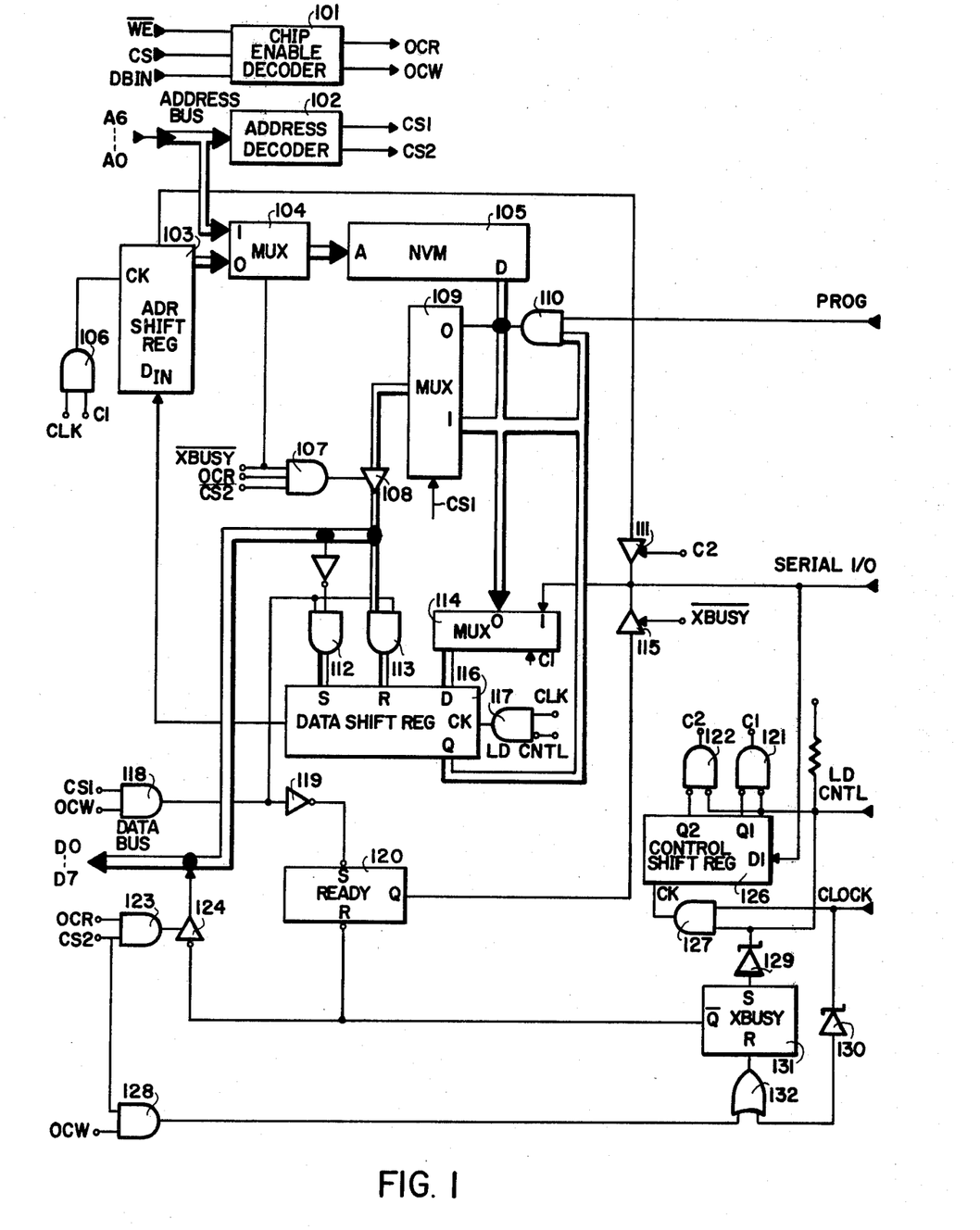
FIG. 1 is a functional block diagram of a bidirectional dual port serially controlled electronically programmable read-only memory.

The arrangement shown in FIG. 1 is designed so as to be able to be packaged in a standard 24 pin dual in line package. Generally speaking, those signals which communicate with the microprocessor are shown on the left side of the drawing, and those which communicate with the external interface are shown on the right side of the drawing. More specifically, those signals which are coupled to the microprocessor are seven address lines A0-A6 coupled into the address bus, data signals D0-D7 coupled to the data bus, a write enable signal ($\overline{WE}$), a chip select (CS) signal and a data bus-in (DBIN) signal. Those signals coupled to the external interface are a programming signal, a load control signal (LD CNTL), a clock signal and, of course, whatever information is transferred over the serial I/O line. In operation, the $\overline{WE}$, CS and DBIN signals are used as inputs to chip enable decoder 101 which produces two control signals OCR (output character read) and OCW (output character write). Control signal OCR is the logical function of the CS input AND'ed with the DBIN input, and the OCW control signal is the logical combination of WE AND'ed with CS. This is shown more clearly in FIG. 2A. The purposes of these two control signals shall be described more fully below.

The seven bit address bus, used to address 128 words in nonvolatile memory 105, is connected to both the address decoder 102 and a 1 of 2 by seven deep multiplexer 104. When the binary data on the address bus corresponds to 127 i.e. 1111111, control signal CS1 is generated. Control signals CS1 and OCW set ready register 120 via AND gate 118 and inverter 119 and either set or reset data shift register 116 via AND gates 112, 113 and 118. In addition, control signal CS1 is used to select one side of the 1 of 2 by 8 deep multiplexer 109.

When the data on the address bus corresponds to 126 (1111110), control signal CS2 is generated which, in conjunction with control signal OCR, provides a reset signal for ready register 120 via AND gate 123 and gate 124 and, in conjunction with OCW, resets the XBUSY register 131. The complement of the CS2 control signal is also used as an input to AND gate 107 which, in conjunction with the OCR and $\overline{XBUSY}$ control signals, provides an enabling output from AND gate 107 to gate 108.

It should be noted that whereas the block diagram depicts only one buffer gate 108, in effect there are eight such gates, one gate corresponding to each one of the eight lines from multiplexer 109.

Figures 3, 7:
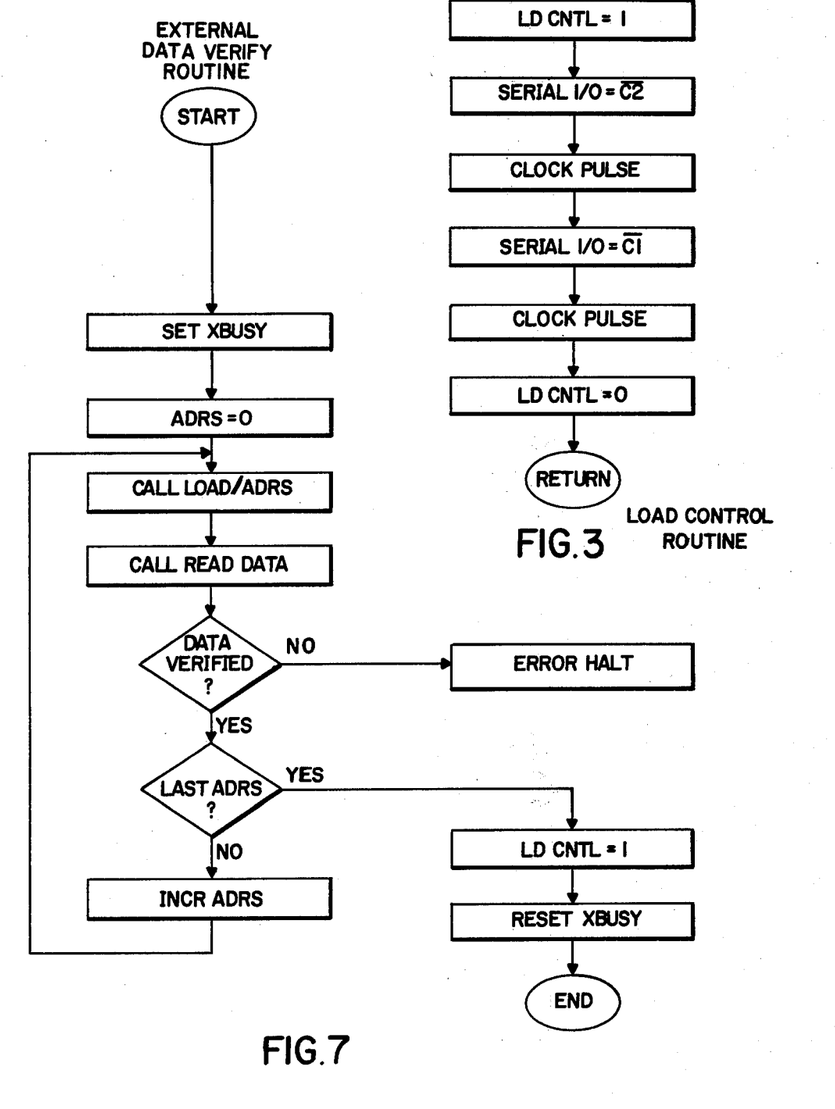
FIG. 3 is a flow chart of the call load control routine employed by the present invention.
FIG. 7 is a flow chart of an external data verify routine.

Two other control signals are generated from inputs appearing at the serial I/O port. These control signals, C1 and C2 are generated as follows. Referring to FIGS. 1 and 3, with a logical one on the load control input, the complement of the C2 output desired is loaded on the serial I/O port and a clock signal generated. AND gate 127 is enabled by the logical "1" at the load control (LD CNTRL) input and passes the clock signal to control shift register 126 which clocks in the $\overline{C2}$ data into the Q1 output of control shift register 126. The complement of the desired C2 output signal is then removed from the serial I/O port and the complement of the desired C1 output signal is placed on that line. Once again with a high level load control input, a pulse at the clock input pin shifts the C2 complement data from output Q1 of control shift register 126 to output Q2 while simultaneously storing the C1 complement at the Q1 output of control shift register 126. At this time the load control signal goes from a logic "1" to a logic "0" so that any further clock signals will not affect the status of control shift register 126.

A logical "1" output at gate 121 (C1) is necessary in order to enable the transmission of data in a serial manner from the address shift register 103 to enabling buffer gate 111. Data is presented to the serial I/O port through buffer gate 111 when C2 is a logical "1". A parallel load of data from nonvolatile memory 105 to the data shift register 116 will occur on each clock edge when C1 is a logical "0". This data path is selected by using control signal C1 as a selector of the 1 of 2 by 8 deep multiplexer 114.

Having explained in general the methods by which the various control signals are generated, specific examples of the utilization of the bidirectional dual port serially controlled electronically programmed read-only memory shall now be discussed. It should be noted that in the following description of operation it will be assumed that a microprocessor is connected to both the address bus and the data bus while the serial I/O port is connected to an external interface that provides serial data only.

When the microprocessor is utilizing the arrangement shown in FIG. 1 as a conventional read-only memory, the XBUSY register 131 is reset by a combination of control signal CS2 and OCW applied to inputs of AND gate 128, the output of which is coupled to an input of OR gate 132. The output of OR gate 132 resets register 131. The $\overline{\text{XBUSY}}$ output indicates that the microprocessor has control and is inverted by gate 124. $\overline{\text{XBUSY}}$ resets the ready signal of register 120 to the logical "0" state, and the XBUSY signal is inserted into the least significant bit position of the data bus by the output of AND gate 123.

The nonvolatile memory portion 105 is addressed by the data on the address bus by appropriate selection of the 1 of 2 by 7 deep multiplexer 104 which is controlled by the $\overline{\text{XBUSY}}$ signal. So long as the address on the address bus is less than 127 ($1111111_2$), control signal CS1 is a logical zero and the nonvolatile memory 105 outputs are gated by multiplexer 109 to buffer 108. Since both the $\overline{\text{XBUSY}}$ and $\overline{\text{CS2}}$ signals are logical "1"'s, the memory outputs can be gated onto the data bus if the OCR control signal is a logical "1".

Thus, when the microprocessor reads a nonvolatile memory, the XBUSY flag is reset and the nonvolatile memory is addressed by the microprocessor address bus. The memory outputs are gated to the inputs of tristate buffers 108 which in turn can be gated onto the data bus by the OCR signal.

In a second mode of operation, i.e. the external interface controls the inventive PROM, a high voltage at the load control (LD CNTL) input causes a breakdown of diode 129 thereby setting the XBUSY flag 131. Selective control of the data paths is then accomplished by serially loading a desired control word into the control shift register 126 in accordance with the flow chart shown in FIG. 3 (Load Control Routine).

The control gates 121 and 122 which produce C1 and C2, are enabled only by a logical "0" at the load control input which also prevents any additional changes in the control shift register 126. When the C1 control signal is a logical "1", the data shift register 116 and the address shift register 103 are loaded serially via the serial I/O port. A total of 15 clock pulses are required to fill these registers as is more clearly depicted in FIG. 6 wherein the load address and data routine is set forth in flow chart form. The serial loading is accomplished when control signal C1 enables AND gate 106 such that clock pulses are applied to the address shift register 103. Also, when C1 is a logical "1", the serial input/output side of multiplexer 114 is selected.

Figures 4, 5, 6:
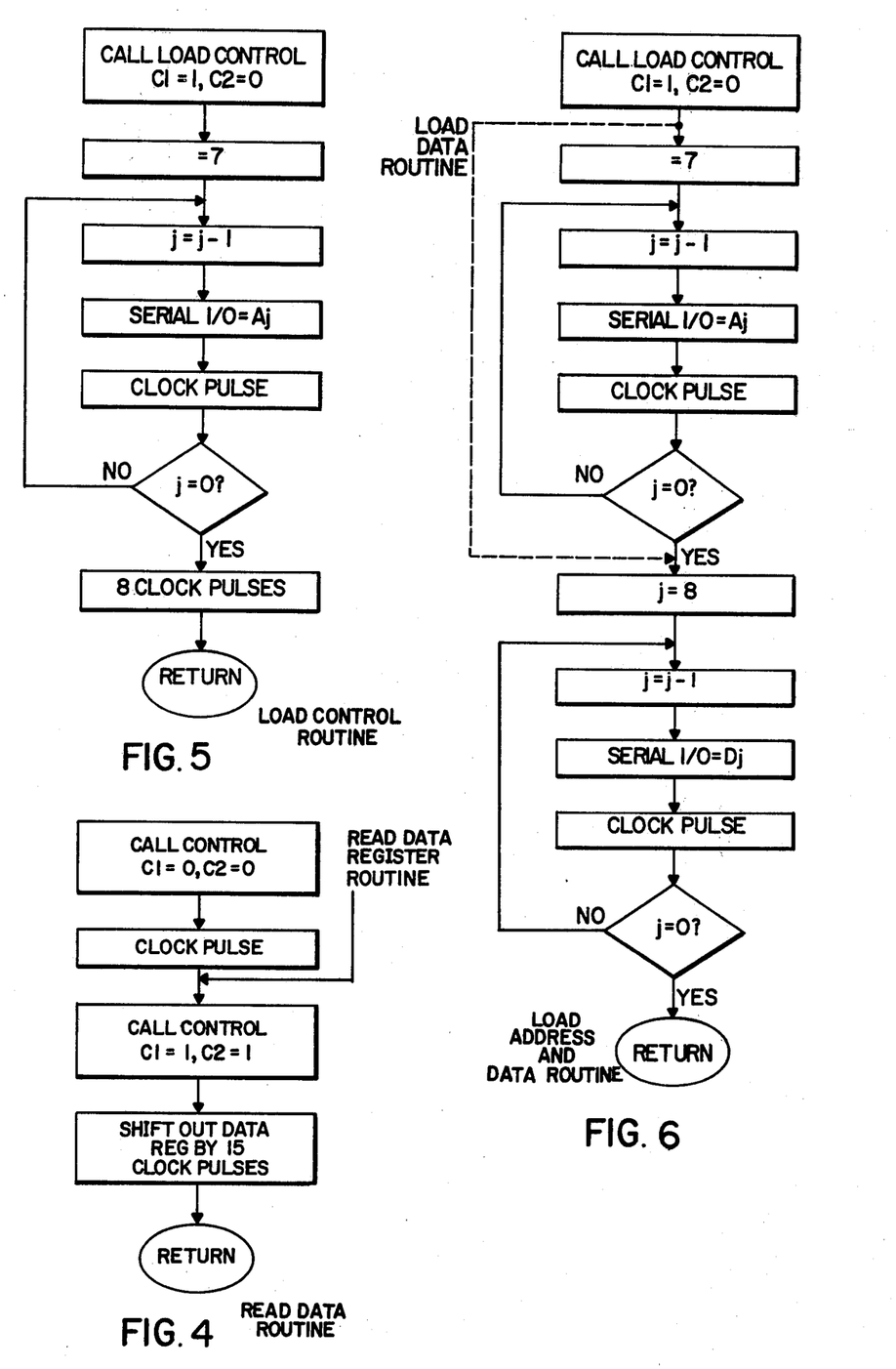
FIG. 4 is a flow chart of the read data routine employed in the present invention.
FIG. 5 is a flow chart of a load address routine.
FIG. 6 is a flow chart of a load address and data routine.

As shown in the load address and data routine of FIG. 6, when C1=1 and C2=0, serial address bits Aj, where j=1-7, are passed through the serial I/O bus through multiplexer 114 and are clocked into the data shift register 116. Next, serial data bits Dj where j=1-8 are likewise applied to multiplexer 114 and are clocked into the data shift register 116. During this data entry process, the address bits which were contained in the data shift register 116 are shifted serially into the address shift register 103.

The load address routine shown in FIG. 5 is similar to the load address portion of FIG. 6, the only difference being in order to clock the address through data shift register 116 into address shift register 103, an additional 8 clock pulses are required as shown in FIG. 5.

When C1 is a logical zero, the data register 116 is loaded in parallel from the nonvolatile memory 105 by a single clock pulse as shown in FIG. 4 which is a flow chart of the read data routine. This data can then be shifted out serially by 15 clock pulses. From the above it can be seen that a total of 30 clock pulses is necessary in order to load an address from the serial I/O port and then transmit the data residing in the nonvolatile memory at a location corresponding to that address back to the external interface.

With the control signals thusly variable, every address location in the nonvolatile memory may be verified by the external interface. The procedure for verifying the nonvolatile memory is shown in flow chart form in FIG. 7.

As shown in FIG. 7, the XBUSY flag 131 is set which indicates that the external interface has control of the inventive PROM. Next, the load address routine is called which results in an address being loaded into address shift register 103 as described previously. Next, the read data routine, previously described, is called which results in that formation being loaded into data shift register 116 from nonvolatile memory 105 in a parallel fashion, and the serial shifting out of this data to the serial I/O port. If the data is verified, the procedure is repeated for the next address until the contents of the last address have been verified. When this occurs, the XBUSY flag is reset. If at any point the data read out of the nonvolatile memory is not verified, then an ERROR HALT will occur.

Figure 8:
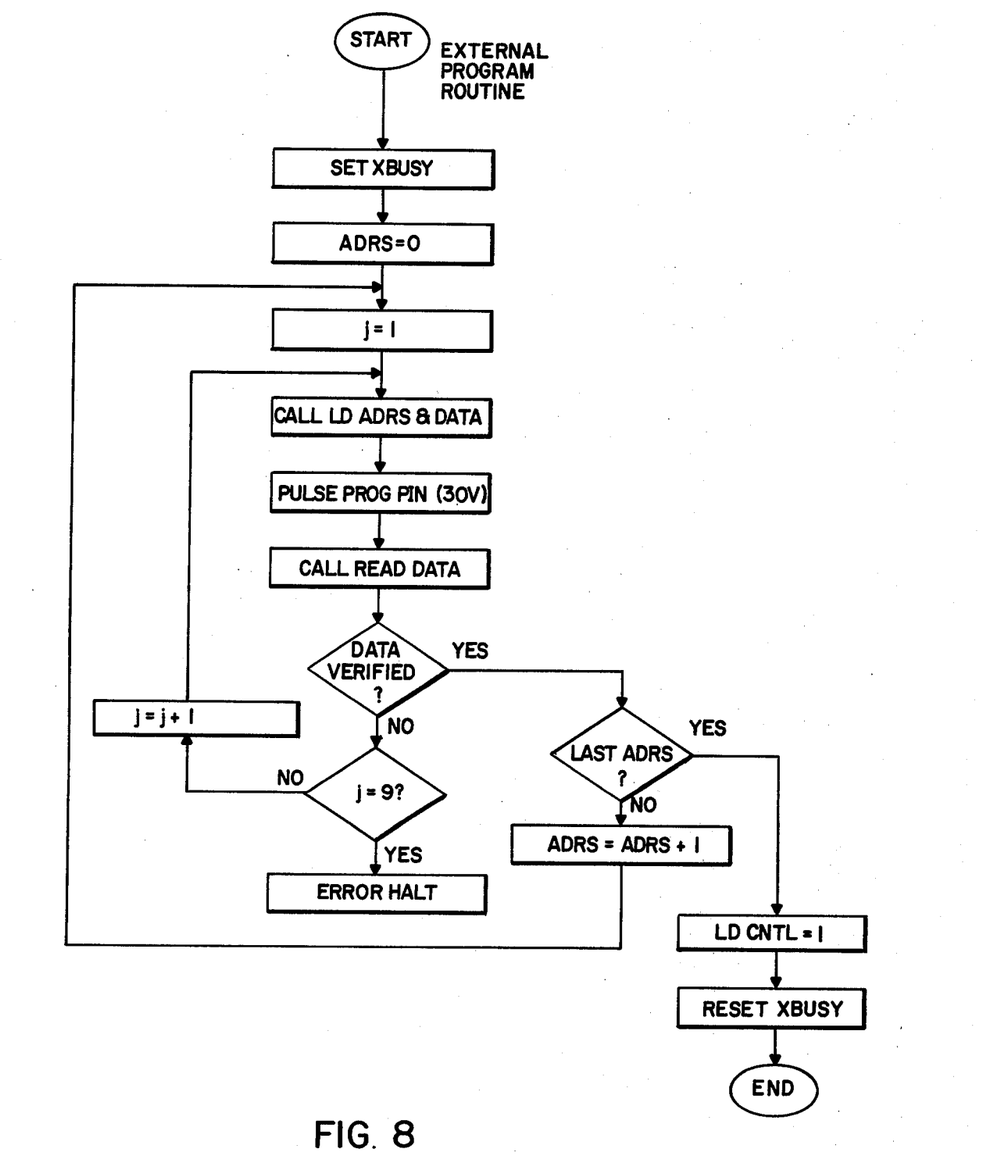
FIG. 8 is a flow chart of the external program routine.

The nonvolatile memory may also be programmed by the external interface. The procedure for programming the nonvolatile memory from the serial I/O port is set forth in flow chart form in FIG. 8. Referring to FIG. 8, in order to program the nonvolatile memory, first the XBUSY flag 131 is set to indicate that the external interface has control. Then, for address=0 and j=1, both an address and data are loaded into the address shift register 103 and the data shift register 116 respectively. Next, those memory locations which are to be programmed with a logical "1" have applied to them a 30 volt fusing pulse. Next, the read data routine previously described is called to verify the programmed data. If the data is correct, the process is continued until the last address in the nonvolatile memory has been programmed at which point the XBUSY flag is reset. As can be seen from FIG. 8, if the data is not verified, it will be re-programmed again and again for a total number of 9 times. After 9 programming attempts, if the data is still not verified, an ERROR HALT will be generated. As shown in FIG. 1 a program pin (PROG) is connected to each of the eight nonvolatile memory outputs via AND gates 110 which are to be programmed with a logical "1". Only those bit positions will see the high level fusing pulse.

Figure 9:
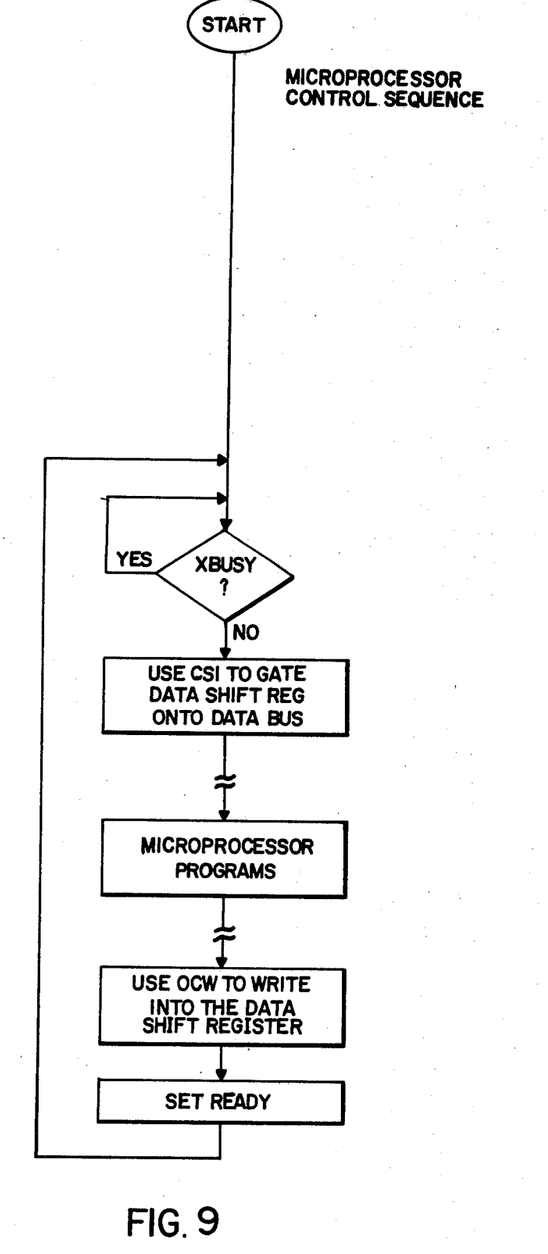
FIG. 9 is a flow chart of the microprocessor control sequence.
Figure 10:
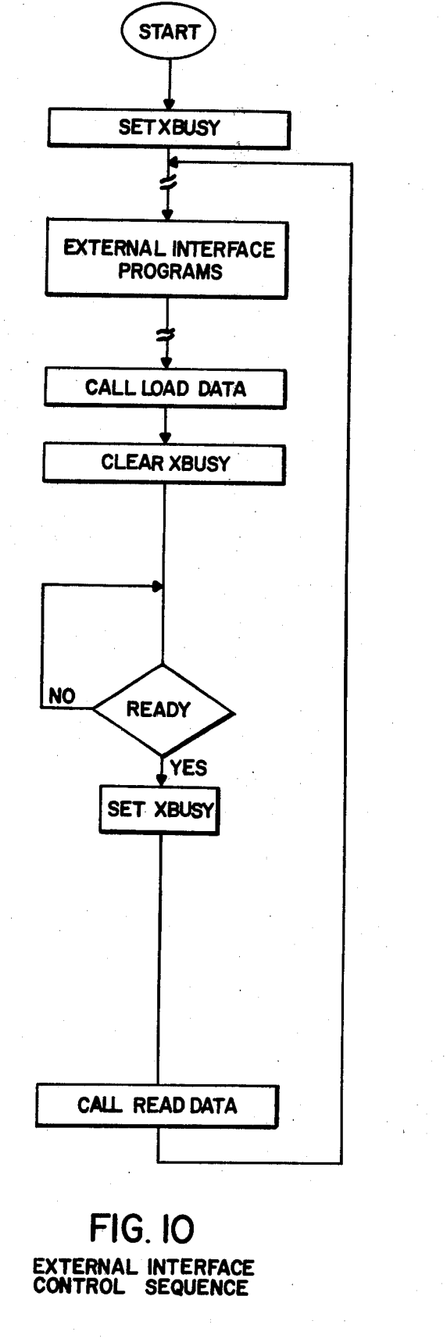
FIG. 10 is a flow chart of the external interface control sequence.

The external interface operating via the serial I/O port can also transfer control and data to the microprocessor by utilizing the control sequence routines set forth in flow chart form in FIGS. 9 and 10. As shown in FIG. 10, the external interface control sequence first requires that the XBUSY flag 131 be set. Once this is done, the external interface can proceed with its external interface program as shown in FIG. 10. To implement the transfer of control, the external interface calls the load data subroutine which results in the serial loading of data into data shift register 116. The XBUSY flag 131 is then cleared. During this time, the microprocessor is in a tight loop checking the status of the XBUSY signal. The XBUSY flag is gated onto the data bus by control signals CS2 and OCR acting through AND gate 123 and gate 124 as shown in FIG. 1. When the microprocessor finds that the XBUSY signal has been cleared, it reads the data register 116 onto the data bus by utilizing control signal OCR through AND gate 107 and control signal CS1 to gate the data shift register output through multiplexer 109 and tristate buffers 108. The microprocessor then resumes its regular programs as shown in FIG. 9.

When the microprocessor desires to transfer control and data back to the external interface, the microprocessor uses the OCW signal to load the information to be transferred from the data bus into the data shift register. This is accomplished by selectively setting or resetting the Q output of the eight dimensional data shift register 116 via AND gates 112 and 113. At the same time the OCW signal also sets the ready flag 120.

Referring once again to FIG. 10, the external interface is in a tight loop testing the status of the ready flag which is gated into the serial I/O port by the $\overline{\text{XBUSY}}$ signal and gate 115. When the external interface gets control (when the ready flag is set to a logical "1"), it sets the XBUSY flag 131 which in turn clears the ready register 120. The transferred information is then read serially using the read data register routine shown in FIG. 4.

Figure 2A:
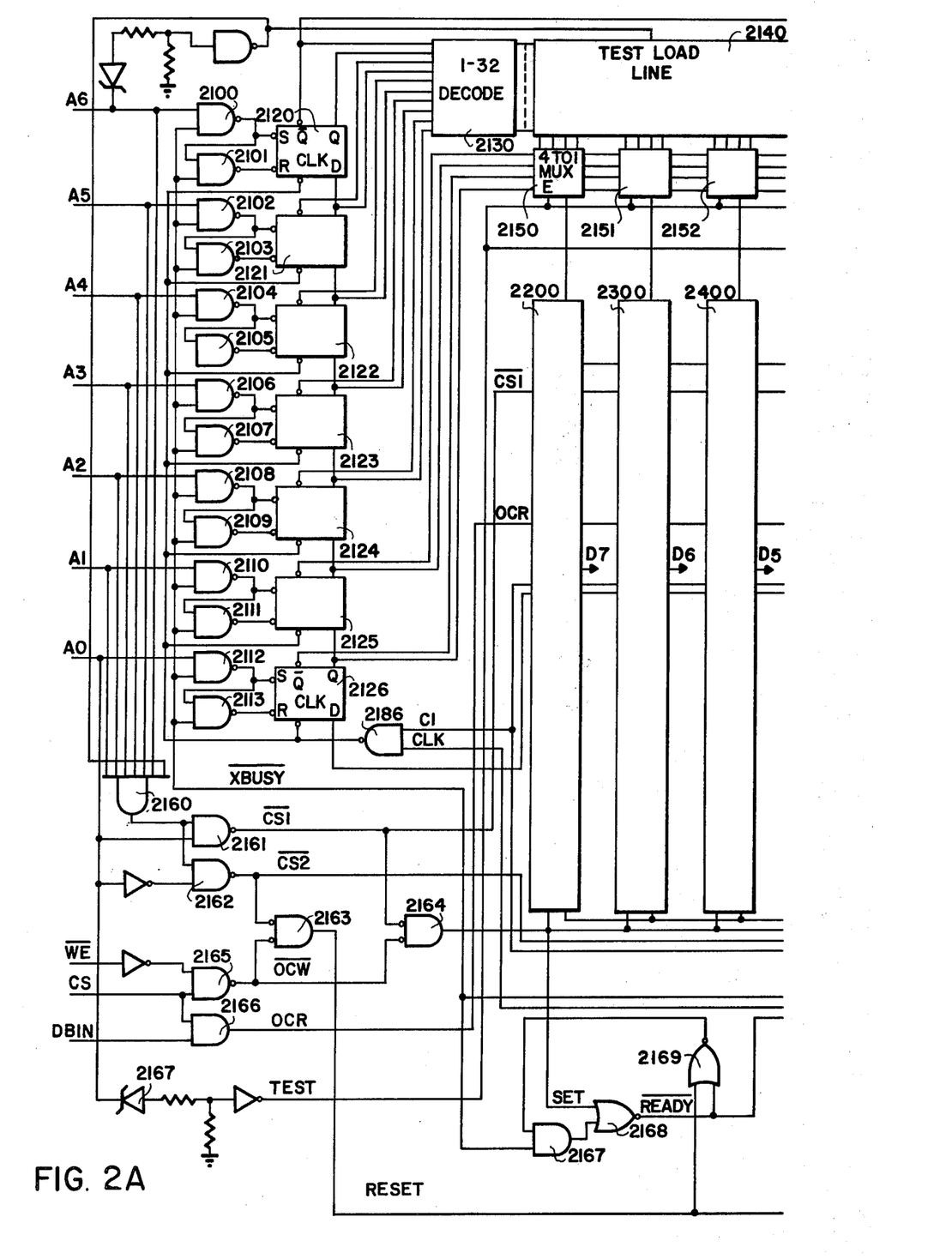
FIGS. 2A and 2B are more detailed logic diagrams of the arrangement shown in FIG. 1.
Figure 2B:
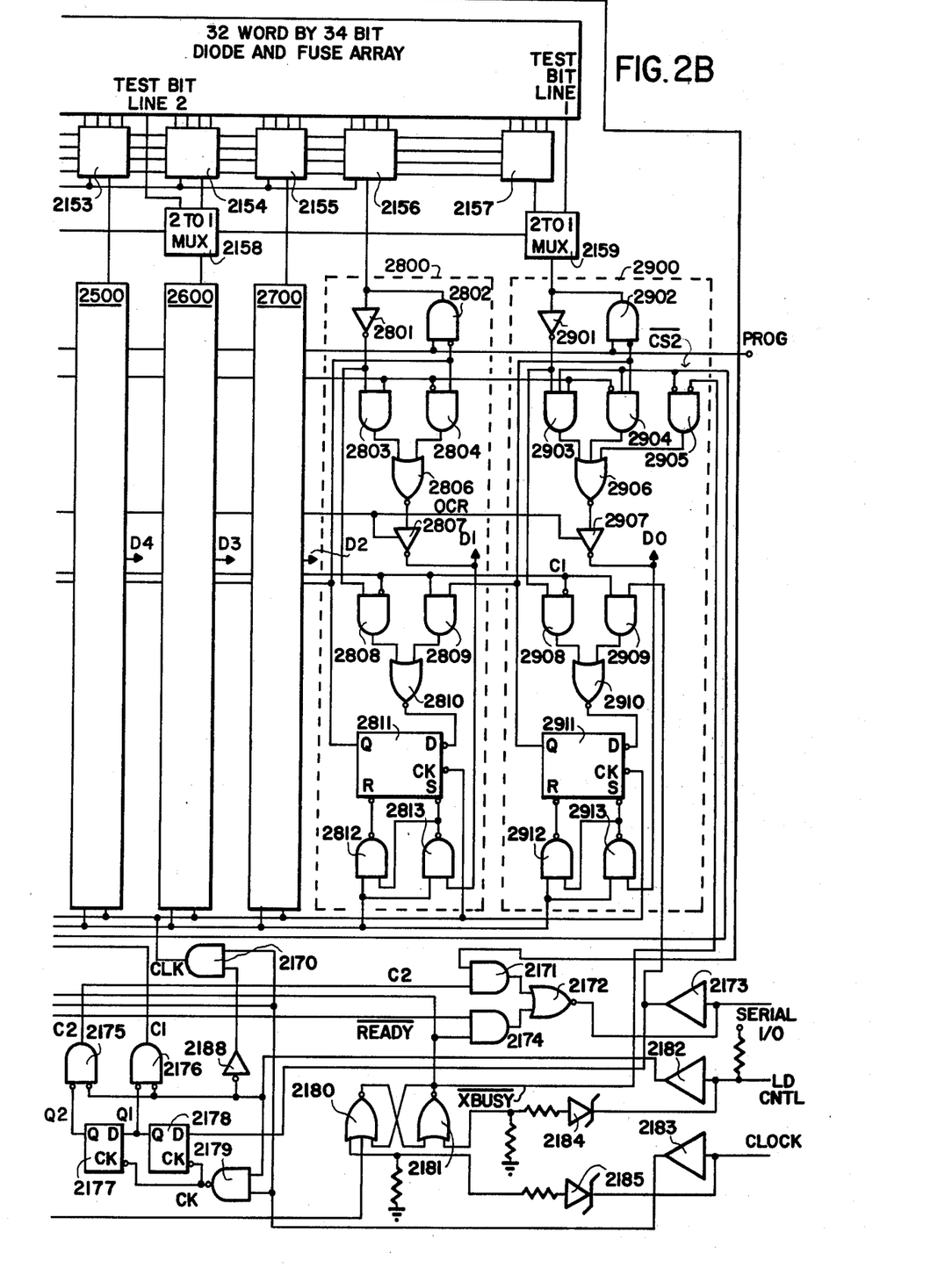

FIGS. 2A and 2B are more detailed logic diagrams of the arrangement shown in FIG. 1. Because of the unique implementation, many of the logic elements shown in FIGS. 2A and 2B serve a multiplicity of purposes and therefore correspond to more than one element or function shown in FIG. 1.

The chip enable decoder 101 in FIG. 1 is implemented in FIGS. 2A and 2B by gates 2165 and 2166, the outputs of which correspond to $\overline{\text{OCW}}$ and OCR. The address decoder 102 of FIG. 1 comprises seven input AND gate 2160 and NAND gates 2161 and 2162 which provide control signals $\overline{\text{CS1}}$ and $\overline{\text{CS2}}$.

Multiplexer 104 and address shift register 103 shown in FIG. 1 are jointly implemented in FIGS. 2A and 2B by NAND gates 2100 through 2113 and the D type flip-flops 2120 through 2126 each having direct set and reset inputs for parallel loading. The control signal $\overline{\text{XBUSY}}$, when a logical "0", disables NAND gates 2100-2113 and thus prevents parallel loading by inhibiting both the set and reset functions on all of the address shift register flip-flops. This allows the data from element 2200 which is the most significant bit (D7) of data shift register 116 (more of which will be explained below) to act as the D input to flip-flop 2126 which, upon subsequent clock inputs, will shift the data in data shift register 116 through the address shift register flip-flops. The $\overline{\text{Q}}$ output of flip-flop 2120, the most significant bit of address shift register 103, is fed to the input of AND gate 2171 for those cases where the data is to be shifted serially through the serial I/O port.

The nonvolatile memory 105 of FIG. 1 comprises elements 2130 through 2159 in FIGS. 2A and 2B. In those instances where the address bus has in parallel loaded an address, the first five bits of that address are applied to 1 of 32 decoder, 2130 which will select one 34 bit word from a 32 word by 34 bit diode and fuse array 2140. The 34 bit output is then broken into 10 separate portions wherein 4 bits go to each eight multiplexers 2150 through 2157 and one test bit is applied to each of multiplexers 2158 and 2159. Ignoring for the moment the use of test bit lines 1 and 2, the last two bits of the address, A1 and A0 are then used to select which one of the four inputs of the 4 to 1 multiplexers shall be passed on to the data shift register elements 2200, 2300, 2400, etc. In this manner each seven bit address is capable of selecting one unique eight bit data word.

The logic circuitry in data shift register elements 2200, 2300, 2400 etc. is shown in detail in element 2800. Element 2900 is identical to the other data shift register elements except that gate 2905 and an additional input to gates 2903 and 2904 have been added. The following description of element 2800 is equally applicable to elements 2200, 2300, 2400, etc.

Gate 2802 in FIG. 2B corresponds to AND gate 110 depicted in FIG. 1. A programming pulse (PROG) is applied to the nonvolatile memory via gate 2802 to blow the fuse array and set the data at the required location. As shown, gate 2802 is enabled by the output of data bit flip-flop 2811. Gates 2803, 2804, and 2806 in FIG. 2B comprise 1 of 2 multiplexer 109 (FIG. 1) whereas buffer 108 in FIG. 1 is represented by gate 2807 in FIG. 2B. Applied to the inputs of gate 2803 is a control signal $\overline{\text{CS1}}$ and an output of the nonvolatile memory via gate 2801. Applied to the inputs of gate 2804 is a control signal CS1 and the output of the associated bit 2811 of the data shift register. When the OCR control signal is applied to gate 2807, either the output from the nonvolatile memory or from the data shift register is applied, via gates 2806 and 2807, to the data bus depending on the state of control signal CS1.

The 1 of 2 multiplexer 114 in FIG. 1 is implemented by gates 2808, 2809 and 2810. The output of gate 2810 is applied to data shift register bit 2911. Gate 2808 has applied to its input $\overline{\text{C1}}$ and an output from the nonvolatile memory via gate 2801. Gate 2809 has applied to its input C1 and the output of the next less significant data shift register bit 2911. (Gate 2909 has applied via this input the signal appearing at the serial I/O port.) Thus, when C1 is a logical "1", data from the serial I/O port will be serially shifted through bits of the data shift register. If C1 is a logical "0" the data shift register 2811 will be loaded from the nonvolatile memory via gate 2810.

The set and reset functions 112 and 113 of FIG. 1 are implemented by gates 2813 and 2812 respectively. Each of gates 2812 and 2813 have applied to one of its inputs the logical function CS1 and OCW via gate 2164. The second input of gate 2813 is coupled to the data bus, and the second input of gate 2812 is coupled to the output of gate 2813. Thus, each of the bits in the data shift register will be controlled in accordance with what is on the data bus when both CS1 and OCW are logical "1"s.

The addition of gate 2905 and the additional inputs to gates 2903 and 2904 serve to gate the status of XBUSY to the Data Bus to inform the user of the parallel inputs that the Serial I/O has control of the device. Gate 106 which clocks the address shift register 103 of FIG. 1 is implemented by gate 2186 of FIG. 2.

Gates 111 and 115 in FIG. 1 are implemented by gates 2171, 2174 and 2172 in FIG. 2. Gate 2171 has applied to its inputs the address shift register output and control signal C2 which, when a logical "1", couples the address shift register output to the serial I/O, via gate 2172. Gate 2174 has applied to its input control signals $\overline{\text{READY}}$ and $\overline{\text{XBUSY}}$, which, when logical "1"s coupled to READY signal to serial I/O port via gate 2172.

The clock gate 117 for the data shift register 116 shown in FIG. 1 is implemented by gates 2188 and 2170 in FIG. 2 which produce the logical function CLK LD CNTL.

Gate 118 of FIG. 1 provides the set/reset enabling signal for the data shift register and the ready register and is implemented by gate 2164 in FIG. 2. The ready register 120 of FIG. 1 is implemented by gates 2167, 2168 and 2169 in FIG. 2.

Control signal C2 and C1, the outputs of gates 122 and 121 respectively in FIG. 1, correspond to the outputs of gates 2175 and 2176 respectively in FIG. 2, whereas the control shift register itself is implemented by flip-flops 2177 and 2178 in FIG. 2. The logical coincidence of a clock signal and load control will result in a clock being applied, via ggate 2179, to flip-flop 2178 whose D input is coupled to the serial I/O port. The output of flip-flop 2178 is applied to the D input of flip-flop 2177, which is likewise clocked by the output of gate 2179. The outputs of flip-flop 2178 and 2177 are coupled to one input of gates 2176 and 2175 respectively. The other input of gates 2176 and 2175 has applied thereto the load control signal.

The XBUSY register 131 of FIG. 1 is implemented by cross coupled NOR gates 2180 and 2181 of FIG. 2. The cross coupled arrangement is set when the load control signal reaches a voltage sufficient to cause diode 2184 to break down resulting in a logical "1" at the input of gate 2181. The input of the reset side of the cross coupled arrangement (gate 2180) is coupled to the clock signal via zener diode 2185. Another input of gate 2180 is coupled to the output of gate 2163 (CS2 and OCW).

Figure 11:
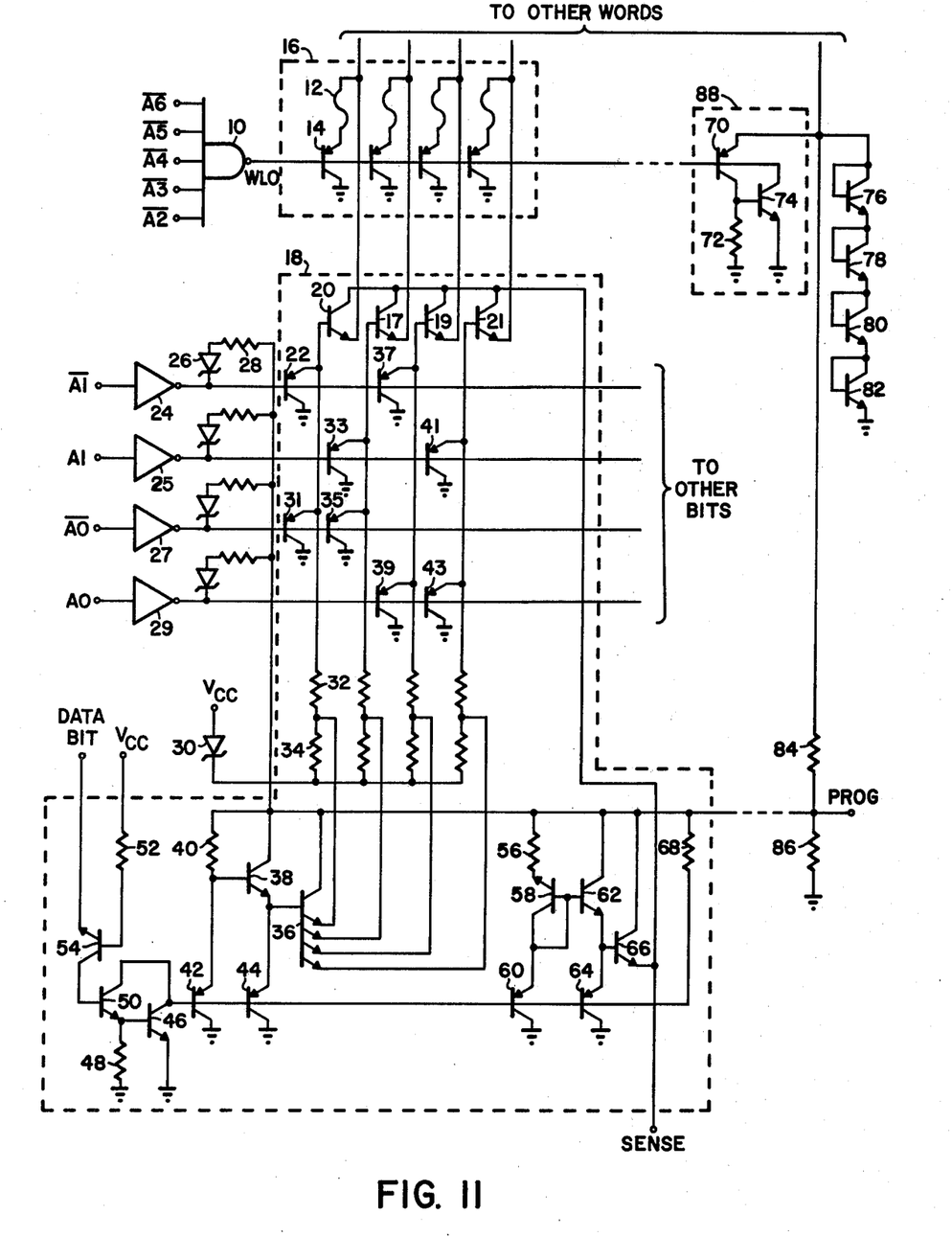
FIG. 11 is a schematic of the memory array.

The PROG input controls circuitry which allows the nonvolatile memory to be programmed. Details of the programming circuitry is shown in FIG. 11. The components contained in block 18 comprise the programming circuitry for one bit of a given eight bit data word, as well as a one of four word decoder. The components in block 16 comprise one bit of each of four eight bit data words. The nonvolatile memory array (ignoring the test words) of the preferred embodiment of the instant invention is arranged as 124 words of 8 bits each. One of 31 word lines similar to WL0 shown is selected by decoding address bits A2 through A6 as previously discussed. Selection of a given word line enables four eight bit words. Selection of one of the four words is then accomplished by the decoding matrix of PNP transistors 22, 31, 33, 35, 37, 39, 41 and 43. This section is equivalent to the 4 to 1 multiplexers 2150 through 2157 of FIGS. 2A and 2B.

The nonvolatile memory array is composed of PNP transistors 14 (see FIG. 11) with fuses 12 in series with their emitters. The array is fabricated with a fuse at each location representing logic "1"'s. In order to store information in the memory, a fuse is blown. This changes the information stored in the memory at that location to a logic "0". Data to be programmed into the nonvolatile memory is first loaded into the data shift register 116 (see FIG. 1) via the parallel or serial data entry means. In order to improve the reliability of the programming, only one fuse at a time is selected for blowing. This is accomplished by loading the 8 bit data registers with seven logical "1"'s and a single logical "0" in the bit position where the fuse is to be blown. The PROG input is then pulsed high (typically 30 volts) with a slow ramp rate (typically 0.5 volts per micro-second). This slow ramp prevents $LV_{ceo}$ breakdowns and minimizes noise generation while blowing the fuse.

The DATA BIT input in FIG. 11 is connected to the Q output of the storage flip-flop in the corresponding bit of the data shift register 116 (see FIG. 1). This flip-flop corresponds to the D-type flip-flop 2911 (see FIG. 2B) for the D0 bit of the data word and is similarly implemented for all 8 bits. The SENSE output in FIG. 11 provides the path for data output from the nonvolatile memory and connects to inverter 2901 (see FIG. 2B) for bit D0, and correspondingly for the other 7 bits.

Assume it is desired to program the D0 bit of word 3 in the nonvolatile memory to a logic "0". First the data register would be loaded with bit D0 set to a logic "0" and bits D1–D7 set to a logic "1". The address bus A0 through A6 would be set to three ($0000011_2$). This would cause the output of gate 10 (word line 0) to be driven low selecting words 0, 1, 2 and 3. Selection of word "3" is accomplished by address bits A0 and A1 through the inverters 24, 25, 27 and 29. In this case said address bits A0 and A1 are both "1"'s, the output of gates 24 and 27 are logical "1"'s, while the outputs of gates 25 and 29 are logic "0"'s. This causes transistors 22, 37, 31 and 35 to be turned off while transistors 33, 41, 39 and 43 are turned on. The net result is the decode matrix of PNP transistors selects one of the four lines for programming thus selecting one word in the nonvolatile memory array. In this case the line connected to the emitters of transistors 22 and 31 and to the base of transistor 20 is allowed to go high while the lines connected to the bases of transistors 17, 19 and 21 are held low thus keeping the transistors off. The bit selected to be programmed comprises PNP transistor 14 and fuse 12. The programming line PROG is held low for normal operation and is taken high as previously described when the fuse is to be blown. In this example, the data bit input would be a logic "0" for data bit D0, thus turning on transistor 54 with base drive being supplied through resistor 52. Transistor 50 would be held off and resistor 48 would hold transistor 46 off. The result of this would be to turn off transistors 42, 44, 60 and 64. The base of these transistors would be pulled up to the programming line voltage by resistor 68. If we assume the program voltage is approximately 30 volts, transistor 38 is turned on through resistor 40, thus turning on transistor 36. This provides base drive to transistor 20 via resistor 32, thus turning on transistor 20. Since the transistors 17, 19, and 21 are held off by the PNP selection matrix the remaining emitters of transistor 36 merely provide current through the resistors equivalent to resistor 32 through the PNP transistors 33, 39, 41 and 43 to ground.

Resistors 28 and Schottky diodes 26 are used to pull the outputs of the inverters 24, 25, 27 and 29 to the programming voltage thus ensuring the bases of the PNP transistors 22–43 are held high. This prevents their being inadvertantly turned on by the programming voltages present on the emitters of transistor 36.

The collector supply voltage to transistor 20 is provided from the emitter of transistor 66. The voltage at the collector of transistor 20 is lower than the voltage provided through resistor 32 to the base thus allowing transistor 20 to saturate and provide a low impedance current path to the fuse 12 through PNP transistor 14. The collector voltage provided to transistor 20 is generated by transistor 58 which is connected as an emitter base zener diode with a collector base short and resistor 56 which is returned to the programming voltage. Thus the base of transistor 62 has a voltage of approximately 6.5 volts below the programming voltage, and the emitter of transistor 62 provides a voltage of approximately 7.2 volts below the programming voltage to the base of transistor 66. The emitter of transistor 66 is thus held at approximately 7.9 volts below the programming voltage or for the 30 volt assumed level at approximately 22.1 volts. The base drive to transistor 20 is supplied through resistor 40 and transistors 38 and 36 at a level of approximately 28.5 volts, thus insuring the saturation of transistor 20. The current supplied through transistor 20 blows the fuse 12 thus completing the programming operation. The current to blow fuse 12 flows in word line "0" back to gate 10 and to ground through transistor 74 in block 88. This circuitry comprising transistors 70, 72, 74, 76, 78, 80 and 82 is described in U.S. patent application Ser. No. 792,940, inventor H. T. Chua, filed May 2, 1977 and assigned to the same assignee as this patent application, on improved PROM's. Block 88 is repeated for each word line in the nonvolatile memory array while the reference string of diode connected transistors 76, 78, 80 and 82 is implemented once for the entire memory array.

For the other data bits which are not to be programmed during that operation the DATA BIT input to transistor 54 is a logic "1" causing transistor 54 to be held off. Transistor 50 and transistor 46 are turned on by current through resistor 52 to the collector-base junction of transistor 54 into the base of transistor 50. This causes the common collectors of transistors 50 and 46 to be held low thus turning on transistors 42, 44, 60 and 64. This causes the bases of transistors 38, 36, 62 and 66 to be held low thus disabling the drive to the collectors and bases of the NPN transistors 20 in those respective bits. This prevents any significant current from being allowed to flow in the fuses which are not to be programmed and virtually eliminates the "half-select" problem of partially programmming fuses by stray currents flowing in the nonvolatile memory array during programming.

In normal operation, with the programming line low, the supply voltage is presented to the PNP transistor selection matrix via Schottky diode 30 and the resistors 32 and 34. The SCR programming improvement in block 88 is disabled by removing the drive to its bias string via returning resistor 84 to ground at the programming input. Data is read from the array through the NPN transistors 20, 17, 19, and 21 and presented into the data shift register via the SENSE line.

Utilization of the data register to store the bit location to be programmed allows the nonvolatile memory array to be programmed using only the address inputs, the program line input and the serial data input. This feature allows the memory to be programmed with only the serial input capability available as well as allowing normal programming through the parallel data inputs. The darlington connected transistors 62 and 66 supply the high current required to reliably blow the fuse 12 thus insuring proper programming.

While the principles of the instant invention have now been made clear in an illustrative embodiment, there will be many modifications as to the structure, arrangement, proportion, elements, materials and components that are obvious to those skilled in the art without departing from those principles. The appended claims are therefor intended to cover and embrace any such modifications within the limits of the true scope and spirit of the invention.

What is claimed is:

1. A bidirectional dual port serially controlled electronically programmable read-only memory comprising, in combination:

means for receiving a plurality of control input signals;

serial input/output port means for transmitting data to and receiving data from said read-only memory in serial form;

plural bit address bus means providing parallel addressing information;

plural bit bidirectional parallel data bus means for transmitting and receiving data in parallel form;

register means for temporary storage of address and data information, said register means coupled to said serial input/output port means for providing serial output data and coupled to said data bus means for providing parallel output data;

multiplexing means coupled to said register means, said address bus means, said data bus means and said serial input/output port means for selectively switching data;

control means responsive to said control input signals and coupled to said register means, said address bus means, said serial input/output port means and said multiplexing means for controlling the interaction of said register means, said multiplexing means, said address bus means, said data bus means, and said serial input/output port means;

nonvolatile memory means coupled to said multiplexing means for producing a plural bit data output; and means for permanently storing in a portion of said nonvolatile memory means data contained in said register means, said portion determined by said multiplexing means.

2. The bidirectional dual port serially controlled electronically programmable read-only memory as recited in claim 1 wherein said multiplexing means further comprises:

a plurality of multiplexers each of which is controlled by said control means for selecting one of a plurality of plural bit data/address words.

3. The bidirectional dual port serially controlled electronically programmable read-only memory as recited in claim 1 wherein said control means comprises:

a serial shift register loadable from said serial input/output port means for providing a first plurality of control signals, said serial shift register responsive to a first plurality of said control input signals;

a first decoding means coupled to said address bus means for providing a second plurality of control signals dependant upon the state of said address bus means:

second decoding means responsive to a second plurality of said control input signals for providing a third plurality of control signals dependant upon the state of said second plurality of said control input signals; and first status means responsive to said first and second decoding means for providing a first status signal to allow said serial input/output port means to control operation of the bidirectional dual port serially controlled electronically programmed read-only memory.

4. The bidirectional dual port serially controlled electronically programmed read-only memory as recited in claim 1 wherein said nonvolatile memory means further comprises:

a plural bit, multiple word, electronically programmable read-only memory; and selection means connected to said electronically programmable read-only memory.

5. A memory system comprising, in combination, data bus means for carrying information; memory means coupled to said data bus means for storing said information; input/output means for providing addressing and control information to said memory means and data information to said data bus means; and control means coupled to said data bus means, said input/output means and said memory means, for transferring parallel data information to and from said data bus means and serial data information to and from said input/output means, said control means comprising:
  multiplexing means for selectively switching data and address information to said data bus means, memory means and input/output means; and
  register means coupled to said multiplexing means for transforming information from a serial format to a parallel format and from a parallel format to a serial format, said register means also storing said control information.

6. A memory system as recited in claim 5 wherein said data bus means further comprises a plural bit bidirectional communication means.

7. A memory system as recited in claim 5 wherein said memory means comprises a programmable read-only memory.

8. A memory system as recited in claim 7 wherein said programmable read-only memory means comprises an electronically programmable read-only memory of the type wherein fuse-links are selectively destroyed.

9. A programmable read only memory (PROM) of a type having a non-volatile memory with fusible links that are selectively blown to cause said PROM to provide predetermined logic signals in response to an address that is applied in parallel at parallel ports and serially at a serial port, comprising:
  register means for storing said serial address;
  multiplexer means for alternatively providing said stored serial address and said parallel address to said nonvolatile memory in response to a control signal; and
  control means for transmitting a data word from said non-volatile memory serially to said serial port and in parallel through a data bus to said parallel ports in response to a control signal.

10. A programmable read-only memory system in accordance with claim 9 including means for coupling input information serially into said register means.

11. A programmable read-only memory system in accordance with claim 1 including means for coupling information serially out of said register means.

12. A programmable read-only memory system in accordance with claim 10 wherein said register means having means for storing information that is read out of said programmable read-only memory array, including means for coupling information serially out of said register means.

13. A programmable read-only memory system in accordance with claim 9 including means for coupling input information in parallel into said register means.

14. A programmable read-only memory system in accordance with claim 9 including means for coupling information in parallel out of said register means.

15. A programmable read-only memory system in accordance with claim 13 including means for coupling information in parallel out of said register means.

16. A programmable read-only memory system in accordance with claim 9 including means for coupling information selectively in serial or in parallel into said register means.

17. A programmable read-only memory system in accordance with claim 1 including means for coupling information selectively in serial or in parallel out of said register means.

18. A programmable read-only memory system in accordance with claim 16 wherein said register means having means for storing information that is read out of said programmable read-only memory array, including means for coupling information selectively in serial or in parallel out of said register means.

19. A programmable read-only memory system in accordance with claim 9 including selection means coupled to said register means for initiating a programming operation in said programmable read-only memory array.

20. A programmable read-only memory system in accordance with claim 19 wherein said selection means comprising means for enabling said register means to select locations in said programmable read-only memory array to be programmed.

21. A programmable read-only memory system in accordance with claim 19 wherein said selection means includes means for selecting for programming only a single bit in said read-only memory array.

22. A programmable read-only memory system in accordance with claim 9 wherein said register means having means for storing information that is read out of said programmable read-only memory array.

* * * * *